United States Patent [19]
Gerry
[11] 4,422,054
[45] Dec. 20, 1983

[54] DISTRIBUTED INDUCTIVE-CAPACITIVE HIGH VOLTAGE IGNITION CABLE

[76] Inventor: Martin E. Gerry, 13452 Winthrope St., Santa Ana, Calif. 92705

[21] Appl. No.: 345,462

[22] Filed: Feb. 3, 1982

Related U.S. Application Data

[63] Continuation-in-part of Ser. No. 282,755, Jul. 13, 1981, and a continuation-in-part of Ser. No. 282,756, Jul. 13, 1981.

[51] Int. Cl.³ ........................ H03H 7/01; H05K 9/00; H01B 7/34

[52] U.S. Cl. ........................................ 333/12; 315/85; 333/24 C; 333/185; 333/202

[58] Field of Search .................. 333/12, 23, 138, 156, 333/167-168, 181-185, 236, 244, 140, 202, 24 R, 24 C, 243, 245; 315/85; 174/32, 36

[56] References Cited

U.S. PATENT DOCUMENTS 3,153,207 10/1964 Brown ................................ 333/167
3,529,304 9/1972 Crandall .............................. 333/140
3,634,785 1/1972 Kameya .............................. 333/140

FOREIGN PATENT DOCUMENTS 519506 3/1940 United Kingdom ............... 333/181

*Primary Examiner*—Marvin L. Nussbaum

[57] ABSTRACT

A high voltage distributed inductance-capacitance cable (10) for an electrical ignition system of a fuel burning engine having an electrically conductive electrode (13) elongated along the length of the cable. A distributed parameter inductor (15) is insulated from and coaxial with such electrode, such electrode being coupled to the inductor by virtue of inherently present distributed capacities ($C_{d2}$) along the length of the cable. One end of the inductor and one end of the electrode are used as the connection points of the cable, the ends opposite the connection points of the electrode and inductor being unterminated. Electrode (13) may be tubular and have a central core (11) at the axis of elongation of the cable. The central core may be conductive and is insulated from the tubular electrode, and such central core may be utilized instead of the tubular electrode in which case one end of the central core will have a connector for use as a cable termination. When core (11) is utilized, distributed capacity ($C_{d1}$) is present to inherently couple such core to distributed inductor ($L_d$).

10 Claims, 11 Drawing Figures

DISTRIBUTED INDUCTIVE-CAPACITIVE HIGH VOLTAGE IGNITION CABLE

CROSS REFERENCE TO RELATED PATENT APPLICATIONS

This application is a continuation in part of copending application Ser. No. 282,755 filed July 13, 1981 and Ser. No. 282,756 filed July 13, 1981, incorporated by reference herein.

DESCRIPTION

1. Technical Field

This invention is in the field of high voltage cables as utilized in engine electrical ignition systems. It is particularly in the field of cables that exhibit radio noise reduction due to ignition current transients without ignition current attenuation. It is also in the field of ignition transformers producing increased energy.

2. Background Art

Noise reduction due to ignition system operation is presently limited to cables having very high ohmic resistance with attenuates generated ignition current by factors greater than 10,000. Such high attenuation affects the ability of an ignition system to provide sufficient ignition current resulting in substantially reduced engine performance and engine operating efficiency, taking its toll in increased fuel consumption that would otherwise not be required.

Presently, the prior art does not possess ignition transformers capable of delivering high energy quantities to the engine's igniters.

DISCLOSURE OF INVENTION

It is therefore an objective of this invention to provide high voltage ignition cables which have substantially zero ohm resistance and a high inductive-capacitive reactance characteristic.

It is another objective of this invention to provide high voltage ignition cables which are based on distributed inductance and distributed capacity for coupling the ignition transformer to the engine's igniters.

It is still another objective of this invention by utilizing distributed inductive-capacitive ignition cables to reduce ignition noise induced in a radio receiver antenna while at the same time increase ignition current.

It is yet another objective of this invention to utilize distributed inductive-capacitive cables in conjunction with an ignition transformer to increase the energy output of the transformer.

Accordingly, an ignition cable based on distributed inductance and capacitance structure appears as an impedance to the transient electrical ignition current flowing therethrough, wherein the inductive and capacitive reactances of the cable act as a distributed filter bank to attenuate radiation at frequencies in the radio broadcast spectrum.

Also, a distributed inductance-capacitance cable may be utilized as an effective shunt across the output or secondary winding of the ignition transformer to dramatically increase its energy output.

BRIEF DESCRIPTION OF THE DRAWINGS

Referring to FIGS. 1, 2 and 7, distributed inductive-capacitive cable 10 incorporates a substantially coaxial structure having a central core 11 with a connecting terminal 21. Core 11 may be metallic, a semiconductor material or an electrically insulating material or may be a magnetic core such as a ferrite material. Sleeve 12 of electrically insulating material coaxially circumscribes core 11 so as to enable electrically conductive tubular member 13 to be coaxially spaced and electrically insulated from core 11 if core 11 is not an insulating material. Member 13 has a connecting terminal 23. Electrically insulating tubular sleeve 14 circumjacent and attached to conductive member 13 provides the requisite spacing between member 13 and inductive winding 15. Winding 15 has a connecting terminal 25 at one end thereof and another connecting terminal 26 at its other end, which other terminal 26 is seldom required, terminal 26 generally being unterminated. Winding 15 is coaxial with member 13 and central core 11, and may be of copper, aluminum, steel or semiconductive material. Winding 15 is embedded in a synthetic resin polymer or other electrical insulation layer 16.

Figure 7:
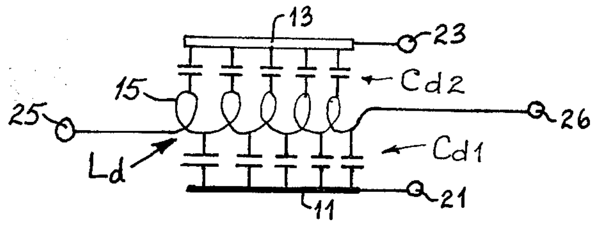
FIG. 7 is an equivalent circuit schematic of the ignition cable of FIGS. 1 and 2 showing its distributed inductance and its distributed capacitance.

It may be seen from the equivalent circuit of FIG. 7 that winding 15 has distributed inductance $L_d$, a specific value of inductance for each turn of winding 15. It may also be appreciated that the distributed capacities $C_{d1}$ and $C_{d2}$ of cable 10 are inherent in the cable by virtue of its construction and proximities of winding 15 to core 11 and tubular sleeve 13. The distributed capacities $C_{d1}$ will appear between each turn of winding 15 and central core 11 when core 11 is conductive or partially conductive, and the distributed capacities $C_{d2}$ will appear between each turn of winding 15 and metallic sleeve 13. Distributed capacities $C_{d2}$ will usually be larger than distributed capacities $C_{d1}$.

Figure 1:
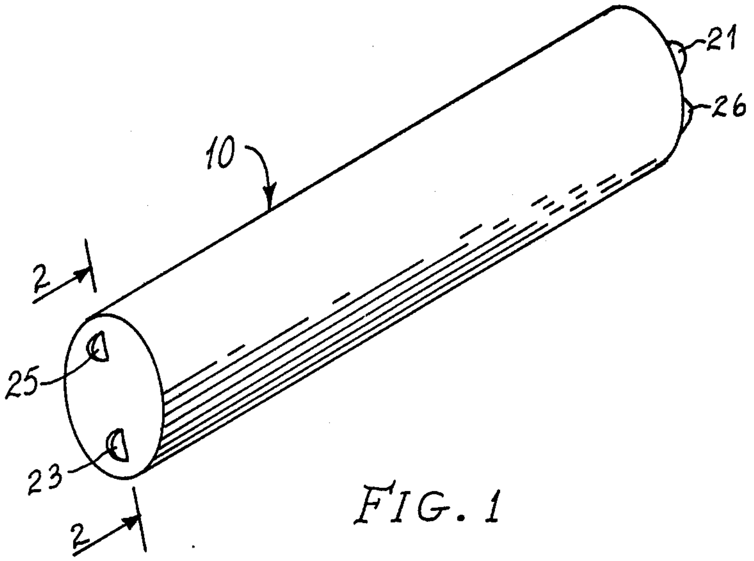
FIG. 1 is a perspective view of a distributed inductive-capacitive ignition cable in accordance with the invention.
Figure 2:
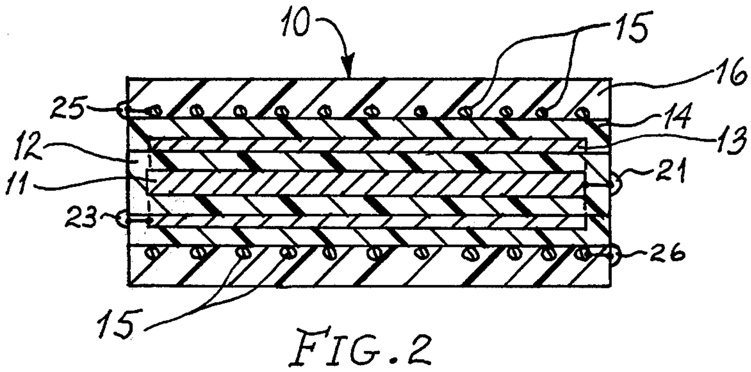
FIG. 2 is a cross-section view taken at plane 2—2 of FIG. 1.

Winding 15 is shown in FIG. 2 substantially magnified in terms of spacing between its turns to enable such winding to be illustrated. In actuality, the turns of the winding may be close to each other inasmuch as the wire used for winding 15 is usually of the magnetic type having a good electrical insulating film thereon.

The most important usage of cable 10 will be wherein one terminal of winding 15, such as terminal 25 is used as one end of the cable and sleeve 13 connected to terminal 23 is used as the other end of the cable, establishing distributed capacities $C_{d2}$ between sleeve 13 and winding 15, or more specifically distributed inductances $L_d$ being coupled to distributed capacities $C_{d2}$.

Referring to FIGS. 3 and 8–11, cable 10 is utilized as a distributed inductive-capacitive shunt across secondary winding 82 of ignition transformer 80, being connected at one end between terminal 25 and the high voltage output port 82*b* of ignition transformer 80, and at the other end between terminal 23 of cable 10 and terminal 82*a* of transformer 80. Such connection provides the distributed inductance-capacity of cable 10 as a shunt for the secondary winding of the ignition transformer to produce a dramatic increase in energy output, as will be seen by the energy increase in waveform of FIG. 11 over the waveform of FIG. 10.

Figure 3:
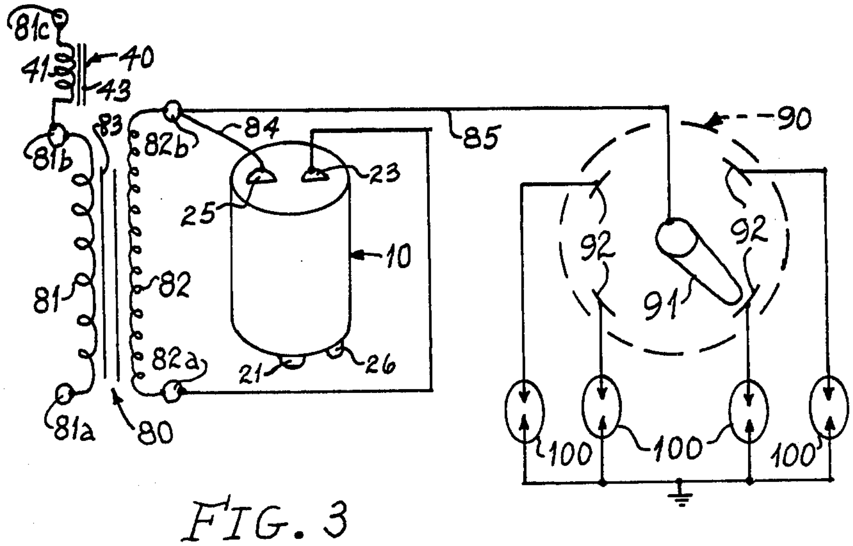
FIG. 3 is an electrical schematic showing the ignition cable of FIGS. 1 and 2 utilized as an energy increasing means for an ignition transformer, and schematically showing its location in an electrical energy ignition distribution system.

FIG. 3 also illustrates the use of a conventional automotive ignition distribution system, excepting for inductor 40 therein, wherein the high voltage output port 82*b* is connected to rotor 91 of distributor 90 by means of cable 85 and shows igniters 100 connected to stationary members 92 of distributor 90.

Figure 10:
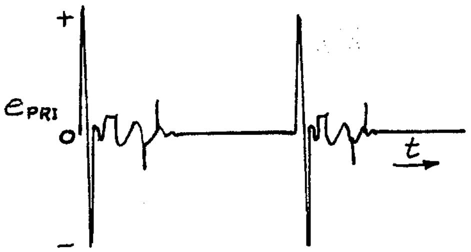
FIG. 10 is a copy of an oscilloscopically obtained induced voltage waveform in the primary winding of an ignition transformer, taken from applicant's prior application.
Figure 11:
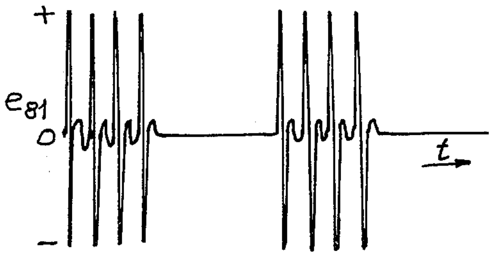
FIG. 11 is an oscilloscopically traced voltage waveform induced in the primary winding of the ignition transformer when utilizing the principles of the invention.

In applicant's prior applications Ser. No. 282,755 and No. 282,756 filed July 13, 1981, the voltage waveform as shown in FIG. 10 was induced in the primary winding of the ignition transformer of such applications, analogous to primary winding 81 herein. Such voltage induced in that primary winding was accomplished by charging an inductor similar to inductor 40 having a winding 41 wound on a magnetizable core 43. Winding 41 was connected between terminals analogous to terminals 81*b* and 81*c*. The inductor was charged at the same time as winding 81 was charged, and the charge for such inductor was discharged through the primary winding at the same time the primary winding was discharged, resulting in an extremely high voltage of $e_{PRI}=2000$ volts peak-to-peak between terminals analogous to terminals 81*a* and 81*b*. With the use of cable 10 shunting secondary winding 82 as in FIG. 3, the induced primary voltage across terminals 81*a* and 81*b* of $e_{81}$ as oscilloscopically measured and illustrated by FIG. 11, remained the same but the number of major waveform excursions multiplied about 4 times, resulting in a higher energy level arc delivered to igniters 100, such arc having substantially greater intensity and observable optical brilliance. Hence, it becomes obvious that cable 10 may be housed in the same casing as inductor 40 and ignition transformer 80 to produce a highly superior-performing ignition transformer. The use of cable 10 within the transformer casing is physically realizable since its total length need be no longer than one-third of a meter, and such length may be folded several times for insertion into the transformer casing.

Figure 8:
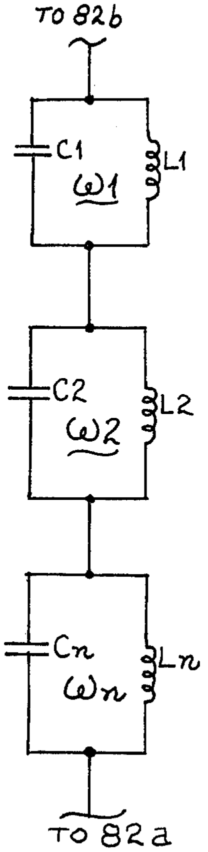
FIG. 8 is one form of a discrete parameter reactance network utilized for spectral band filtering as an alternative to a distributed parameter network.
Figure 9:
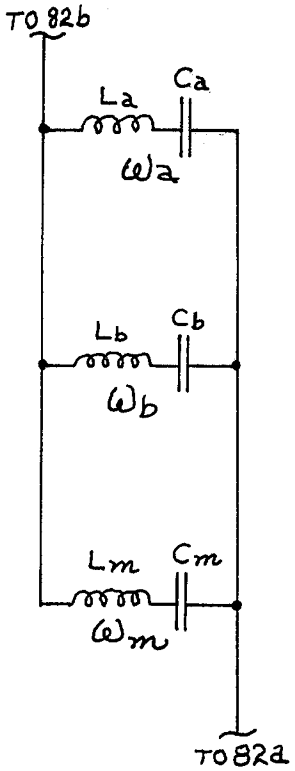
FIG. 9 is another form of a discrete parameter reactance network utilied for spectral band filtering as an alternative to a distributed parameter network.

An appreciation for the two terminal reactance networks of FIGS. 8 and 9 will be of help to understand the superiority of the distributed inductance-capacity arrangement. These two terminal networks were made possible by the development of Foster's Reactance Theorem which showed that these networks of ideal inductance and capacitance components give rise to poles and zeros over any given spectral range of frequencies. Such network theroy will offer some understanding for the reasoning behind the superior distributed inductance-capacity networks possessed by cable 10. The two terminal networks of FIGS. 8 and 9 have practical limitations in terms of a limited number of inductive-capacitive pairs of components being structurally practical. However, a virtually infinite number of inductance-capacitance components are present by virtue of the distributed inductance coupled to the distributed capacities of cable 10, to enable complete coverage of a broad frequency spectrum and thereby enable a small-sized filter to cover an entire broadcast band, to actually make noise reduction and transformer shunt filters practical of realization.

The significance of Foster's Reactance Theorem and the networks of FIGS. 8 and 9 resulting therefrom, is the establishment of a network having an impedance function comprising ideal inductors and capacitors, wherein their resistive components are neglected in establishing the network parameters. The significance of a pole is where a combination of inductance and capacity in parallel will cause the network reactance to approach infinity for a specific frequency $\omega$. The significance of a zero is where a combination of inductance and capacity in series will cause the network reactance to approach zero at a specific frequency $\omega$.

It is not the purpose of this invention to elaborate on Foster's Reactance Theorem or the networks of FIGS. 8 and 9 resulting from its application, inasmuch as such theory is adequately covered in most electrical engineering textbooks, for example in Radio Engineers' Handbook by Terman, 1st Edition 1943, at pages 200–202, published by McGraw-Hill Book Company, New York, and in Communications Engineering by Everitt and Anner, 3rd Edition 1956, at pages 172–174, published by McGraw-Hill Book Company, New York.

FIGS. 8 and 9 show either of the Foster types of discrete two terminal networks connected across secondary 82 between terminals 82*a* and 82*b*, and hence usable as a reactive shunt for transformer 80 subject to the limitations of such networks as discussed above.

The poles at frequencies $\omega_1, \omega_2 \ldots \omega_n$ of FIG. 8 network are readily established in terms of each set of inductive-capacitive components by the relationships $$\omega_1 = \frac{1}{\sqrt{L_1C_1}}\,;\ \omega_2 = \frac{1}{\sqrt{L_2C_2}}\,;\ \ldots\ \omega_n = \frac{1}{\sqrt{L_nC_n}}$$

thus establishing the pole frequencies in radians per second at which a pair of parallel connected inductor-capacitor components will cause the network to exhibit infinite reactance.

The zeros at frequencies $\omega_a, \omega_b \ldots \omega_m$ of FIG. 9 network are readily established in terms of each set of inductive-capacitive components using the relationships $$\omega_a = \frac{1}{\sqrt{L_aC_a}}\,;\ \omega_b = \frac{1}{\sqrt{L_bC_b}}\,;\ \ldots\ \omega_m = \frac{1}{\sqrt{L_mC_m}}$$

thus establishing the particular frequencies in radians per second at which a pair of series connected components of inductance-capacitance will cause the network to exhibit zero reactance.

Each of the Foster networks of FIGS. 8 and 9 will exhibit poles and zeros in alternation, and such occurrances are adequately explained in the referenced textbooks above.

In its usage, the filter network of FIG. 9 will lend itself better for connection as a shunt across terminals 82*a*–82*b* of secondary winding 82, whereas the filter network of FIG. 8, although similarly usable as a shunting by-pass network to eliminate broadcast band frequencies by establishing its zeros within the range of the broadcast band and its poles outside the broadcast band range, such network will be best usable as a high voltage cable coupling the secondary winding 82 to igniters 100 under conditions of establishing its poles within the broadcast band range for suppressing such broadcast band frequencies and its zeros outside such broadcast band range.

Practically, it would require several thousand pairs of inductor-capacitor components to establish a filter network effectively covering the radio broadcase band.

The distributed parameter inductive-capacitive network as utilized by cable 10 in FIG. 3 arrangement probably resembles in theory the reactive network of FIG. 9 more closely than the network of FIG.8 subject to the practical limitations of the number of inductive-capacitive component pairs possible in such discrete component networks. Such distributed parameter network constitutes the equivalent of an infinite number of inductor-capacitor combinations, or at least several thousand inductor-capacitor combinations in a very simple to realize and practical structure, and it is for that reason that a distributed parameter network is far superior to a lumped parameter network, whether used as a transformer shunt or as a high voltage ignition cable.

Figure 4:
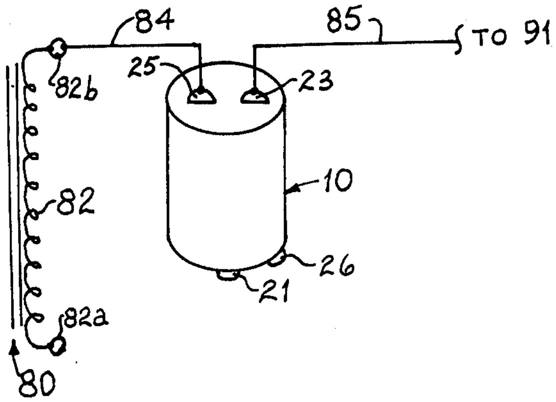
FIG. 4 is a partial electrical schematic showing the ignition cable of FIGS. 1 and 2 used as a noise reduction cable in the ignition system illustrated in FIG. 3.

Referring to FIGS. 4 and 7, cable 10 is shown as utilizing the distributed inductive-capacitive parameters as a high voltage coupling cable between the high voltage ignition transformer port 82*b* and rotor 91 of distributor 90. In such structure, only one end of winding 15 is connected at terminal 25 to port 82*b*, and connecting terminal 23 of conductive sleeve 13 is connected to rotor 91. Thus, distributed inductance $L_d$ is coupled to rotor 91 via distributed capacity $C_{d2}$, providing a noise reduction distributed inductive-capacitive cable that acts as a distributed parameter filter having an infinite number of inductive-capacitive parameters to attenuate radiation at frequencies in the radio broadcast spectrum.

Figure 5:
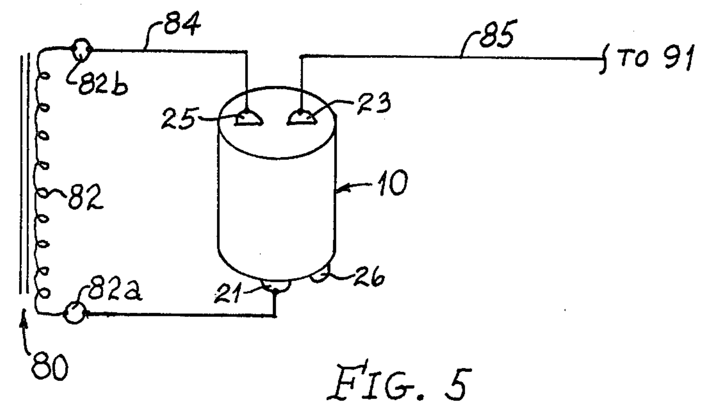
FIG. 5 is a partial electrical schematic showing the ignition cable of FIGS. 1 and 2 utilized as both an energy increasing means for an ignition transformer and a noise reduction cable in the ignition system illustrated in FIG. 3.

Referring to FIGS. 5 and 7, cable 10 is utilized as a shunt by connection of terminals 21 and 25 across secondary winding terminals 82*a* and 82*b* respectively, thereby creating a distributed inductance $L_d$ and distributed capacities $C_{d1}$ thereacross. Cable 10 is also used as a high voltage distribution means by virtue of terminal 25 being connected via 84 to terminal 82*b*, and terminal 23 being connected via 85 to rotor 91. Such arrangement couples distributed inductances $L_d$ to distributed capacities $C_{d2}$ to establish the distributed inductive-capacitive high voltage ignition distribution cable.

Figure 6:
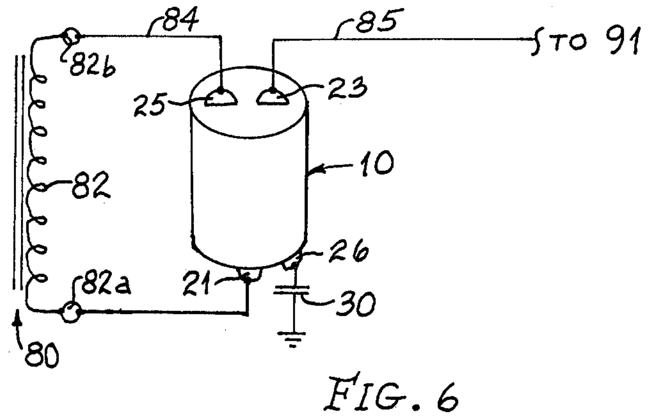
FIG. 6 is a partial electrical schematic of the ignition cable of FIGS. 1 and 2 utilized in another manner as both an energy increasing member for an ignition transformer and a noise reduction cable in an ignition system illustrated in FIG. 3.

Referring to FIGS. 6 and 7, the arrangement as discussed in conjunction with FIGS. 5 and 7 apply, with the additional coupling of the other terminal 26 of winding 15 to ground via capacitor 30. Capacitor 30 is a relatively small valued capacitor of about 100 picofarads that maintains a relatively high reactive load across winding 82 by the addition of its capacitive reactance in series with winding 15 and maintaining a resonably high reactive shunt across secondary winding 82.

I claim:

1. A high voltage distributed inductance-capacitance cable for an electrical ignition system of a fuel burning engine, said system having an ignition transformer with primary and secondary windings, said cable being coupled to the secondary winding, wherein said cable comprises the combination of:

an electrically conductive electrode elongated along the length of said cable; and a distributed inductor coaxial with and electrically insulated from said electrode, said electrode and inductor being coupled to each other by distributed capacity therebetween along the length of said cable, said cable having a first end and a second end, said electrode being open-circuited at the first end and said inductor being open-circuited at the second end, said inductor at the first end and said electrode at the second end being connective portions of the cable.

2. The invention as stated in claim 1, wherein said electrode is tubular, and including a core coaxial with, electrically insulated from and internal said tubular electrode.

3. The invention as stated in claim 2, wherein said core is of magnetic material.

4. The invention as stated in claim 2, wherein said core is of semiconductor material.

5. The invention as stated in claim 2, wherein said core is of electrically conductive material.

6. The invention as stated in claim 2, including an electrically insulating layer between said core and said tubular electrode.

7. The invention as stated in claim 2, including an electrically insulating layer between said tubular electrode and inductor.

8. The invention as stated in claim 2, including a first electrically insulating layer between said tubular electrode and inductor, and a second electrically insulating layer covering said inductor and forming an outer insulating member for said cable.

9. The invention as stated in claim 1, wherein said cable is shunt coupled to the secondary winding.

10. The invention as stated in claim 1, including an electrical igniter wherein said cable serially couples the igniter to the secondary winding.

* * * * *